United States Patent [19]

Longcor et al.

[11] Patent Number: 4,987,465
[45] Date of Patent: Jan. 22, 1991

[54] ELECTRO-STATIC DISCHARGE PROTECTION DEVICE FOR CMOS INTEGRATED CIRCUIT INPUTS

[75] Inventors: Steven W. Longcor, Mountain View, Calif.; Kuang-Yeh Chang, Austin, Tex.; Jih-Chang Lien, San Jose; David M. Rogers, Sunnyvale, both of Calif.

[73] Assignee: Advanced Micro Devices, Inc., Sunnyvale, Calif.

[21] Appl. No.: 266,223

[22] Filed: Oct. 28, 1988

Related U.S. Application Data

[63] Continuation of Ser. No. 8,703, Jan. 29, 1987, abandoned, which is a continuation-in-part of Ser. No. 761,223, Jul. 31, 1985.

[51] Int. Cl.⁵ ............................................. H01L 29/78
[52] U.S. Cl. .................................. 357/23.13; 357/41; 361/91
[58] Field of Search .................. 357/23.13, 41; 361/91

[56] References Cited

U.S. PATENT DOCUMENTS

| | | | |
|---|---|---|---|
| 4,131,908 | 12/1978 | Daub et al. | 357/23.13 |
| 4,449,158 | 5/1984 | Taira | 357/23.13 |
| 4,476,476 | 10/1984 | Yu et al. | 357/23.13 |
| 4,527,213 | 7/1985 | Ariizumi | 357/23.13 |
| 4,543,593 | 9/1985 | Fujita | 357/23.13 |
| 4,580,063 | 4/1986 | Torelli et al. | 357/23.13 |
| 4,602,267 | 7/1986 | Shirato | 357/23.13 |
| 4,656,491 | 4/1987 | Igarashi | 357/23.13 |
| 4,733,285 | 3/1988 | Ishioka et al. | 357/23.13 |
| 4,763,184 | 8/1988 | Krieger et al. | 357/23.13 |

OTHER PUBLICATIONS

*Electrical Overstress... Proceedings,* 1984, Oct. 2-4, "A CMOS in DIFIDW", Lin et al., pp. 202-209, Phila., Pa.

Primary Examiner—Jerome Jackson, Jr.
Attorney, Agent, or Firm—Fliesler, Dubb, Meyer & Lovejoy

[57] ABSTRACT

An ESD protection device for CMOS integrated circuit inputs is disclosed. Two clamp components, coupled by a current limiting device, couple the pad to the circuitry of the chip. The device prevents damage to the circuit from an ESD of approximately 8000 or more volts at an input terminal.

11 Claims, 14 Drawing Sheets

ELECTRO-STATIC DISCHARGE PROTECTION DEVICE FOR CMOS INTEGRATED CIRCUIT INPUTS

CROSS-REFERENCE TO RELATED APPLICATION

This application is a continuation of application Ser. No. 008,703, filed Jan. 29, 1987, now abandoned, which is a continuation-in-part of application Ser. No. 761,223; filed July 31, 1985.

BACKGROUND OF THE INVENTION

1. Field of the Invention

The present invention generally relates to integrated circuit protection devices and, in particular, to a device for protecting an integrated circuit from damage which can be caused by electro-static discharge into an input terminal.

2. Description of the Related Art

A chronic problem associated with semiconductor integrated circuits is the destruction which can be caused by electrostatic discharge (ESD) into any one of the external connector pins. It is commonly known that a 20 to 30 volt discharge into the die interior can result in fatal damage such as junction breakdown, contact breakdown, thermal burnout and, in circuits using gated components, breakdown of the gate oxide layers. Yet in handling a packaged semiconductor chip with exposed terminal pins, simple static discharge from a finger tip can achieve an instantaneous level of tens of thousands of volts.

A common solution to the problem is to convert the high voltage to a current and conduct the current off the die to ground at the terminal pad before incursion into the die. Conventional layouts to create such a shunt path generally use diodes or transistors to act as a clamp device.

One integrated circuit protection device is taught by Avery in U.S. Pat. No. 4,400,711, issued Aug. 23, 1983. Avery teaches an MOS transistor to turn on a silicon controlled rectifier.

In the state of the art, protection devices have been able to dissipate approximately 2000 volts of ESD into a pin. However, with these devices destructive junction breakdown has been found to occur in shallow junction CMOS circuits with an ESD of 500 to 1000 volts. Hence, the available devices are often inadequate, with the result being the destruction of the operability of the integrated circuit.

SUMMARY OF THE INVENTION

It is a principal object of the present invention to provide a protection device for integrated circuits which will improve the immunity of the die to ESD inputs.

It is another object of the present invention to provide a MOS structure for protecting a CMOS integrated circuit die against ESD inputs.

It is a further object of the present invention to provide an ESD protection structure for a CMOS integrated circuit which will prevent damage to the circuit from an ESD of greater than 5000 volts at an input terminal.

It is yet another object of the present invention to provide a CMOS integrated circuit ESD protection device which has a layout adaptable to a large variety of integrated circuits.

In its broad aspect, the present invention provides an ESD protection device for a CMOS integrated circuit. A first clamping structure is coupled to the input of the integrated circuit. A second clamping structure is coupled to the first clamping structure by a current limiting device. The first device sinks a large amount of the current caused by the ESD to ground and clamps its input node to a lower voltage than the ESD voltage. Current flow to the second clamp is limited by the limiting device and clamps the circuit input at a voltage which is much lower than the breakdown voltage of the circuit components.

The first clamping structure of the present invention may have several configurations, for example, a lateral NPN bipolar transistor. In another embodiment of the present invention the first clamping MOS structure is an n-well to n+ MOS device. In yet another embodiment of the present invention the first clamping structure is an n+ to n+ MOS device. A further embodiment utilizes an n+ to n+ MOS device having a ballast resistor between the input of the first clamping structure and the n+ drain region of the n+ to n+ MOS device.

Other objects, features and advantages of the present invention will become apparent upon consideration of the following detailed description and the accompanying drawings, in which like reference designations represent like features throughout the FIGURES.

DETAILED DESCRIPTION OF THE INVENTION

Reference is now made in detail to specific embodiments of the present invention, which illustrate the embodiments presently contemplated by the inventors for practicing the invention. Various embodiments are briefly described and set forth in the accompanying drawings. The drawings referred to in this description should be understood not to be drawn to scale except if specifically noted. Moreover, the drawings are intended to illustrate only one portion of an integrated circuit chip fabricated in accordance with the present invention. Furthermore, the construction of any individual integrated circuit device is dependent upon the fabrication technology being employed, e.g., 1.5 micron, 2 micron, etc. hence, the specific sizes and concentrations or dosages detailed in this description are intended as examples of the best mode currently contemplated using available technology and are not intended as any limitation on the practice of the invention.

Figure 1:
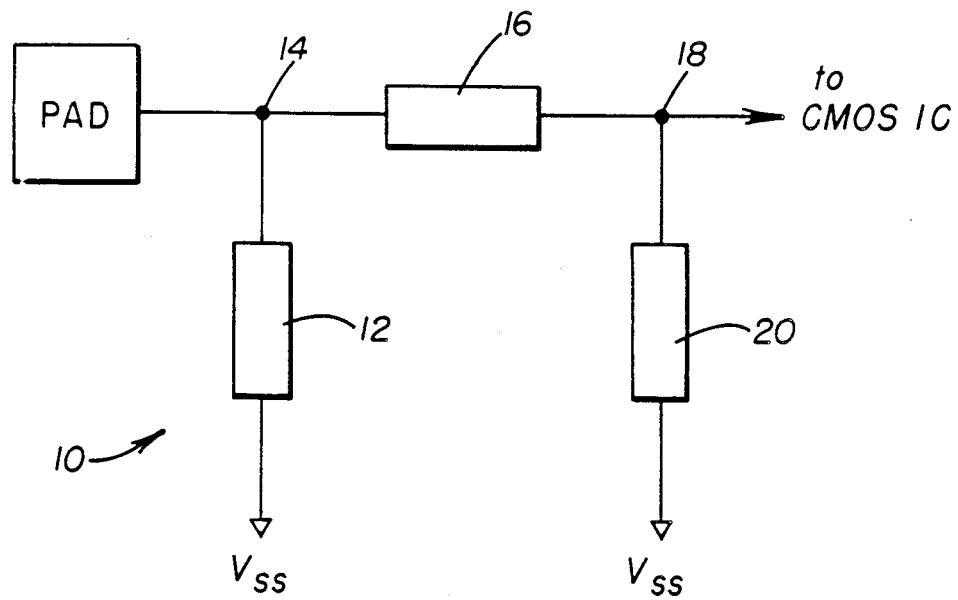
FIG. 1 is a schematic block diagram of the device according to the present invention.

As shown in FIG. 1, the electro-static discharge protection device 10 of the present invention has three components. A first clamp component 12 has an input node 14 coupled to the pad of the integrated circuit chip. The other terminal of the first clamp 12 is coupled to the ground potential of the chip, Vss. The function of the first clamp 12 is twofold: to sink as much current caused by an electro-static discharge as possible from the pad to the circuit ground, and to clamp node 14 to approximately the turn-on voltage of the first clamp component 12. Details regarding various embodiments of the first component 12 and, hence, of the overall device 10, are discussed with respect to FIGS. 2 through 9, 11, 12, and 15 below.

The second component 16 of the ESD device 10 has its input coupled to node 14. The function of the second component 16 is to limit the current flow to its output node 18 which also serves as the input node 18 to the third component 20 of the ESD device 10. A simple dropping resistor, such as a doped semiconductor region in the substrate or a semiconductor layer, such as polysilicon, on the substrate coupled to the input nodes 14, 18 of the active devices 12, 20 has been found to suffice to serve this function. In the preferred embodiment, an n-well region doped to provide a resistance of approximately 3000 ohms has been used. It is believed that a resistance as low as 1000 ohms can suffice depending upon the layout of the entire ESD device 10.

The third component 20 of the ESD device 10 has its input coupled to node 18. This component 20 is also a clamp which has a dual function. The first is to sink to the circuit ground as much as possible of the input current passed by the second component 16; the second is to clamp node 18 to approximately the turn-on voltage value of the clamping component 20. In the main, as a substantial portion of the current has been sunk by component 12 and the input to the second clamp 20 is controlled by the limiter 16, it has been determined that a MOS thin-oxide, grounded gate enhancement type FET suffices to perform these two functions. The gate and source of the FET are both coupled to the circuit ground. In the test device, a FET of this type proportioned to a 4 micron channel length, and having a clamping voltage of 14 volts, was employed successfully as the second clamping component 20. Clamping the input node 18 at approximately the turn-on voltage of the second clamp 20 and using this node 18 as the input to the heart of the CMOS integrated circuit (not shown), prevents an input voltage of a magnitude which could damage oxide layers, junctions, etc., within the chip.

At this point of the description, it should be noted that the construction of such an ESD device 10 and its components 12, 16, 20 can be performed in accordance with known-in-the-art integrated circuit fabrication techniques. Thus, no elaboration is required herein. Reference can be made to classical texts such as *Semiconductor & Integrated Circuit Fabrication Techniques*, Reston Publishing Company, Inc., copyright 1979 by the Fairchild Corporation. Moreover, the individual components and device can be constructed using commercially available integrated circuit fabrication machines.

Figure 2:
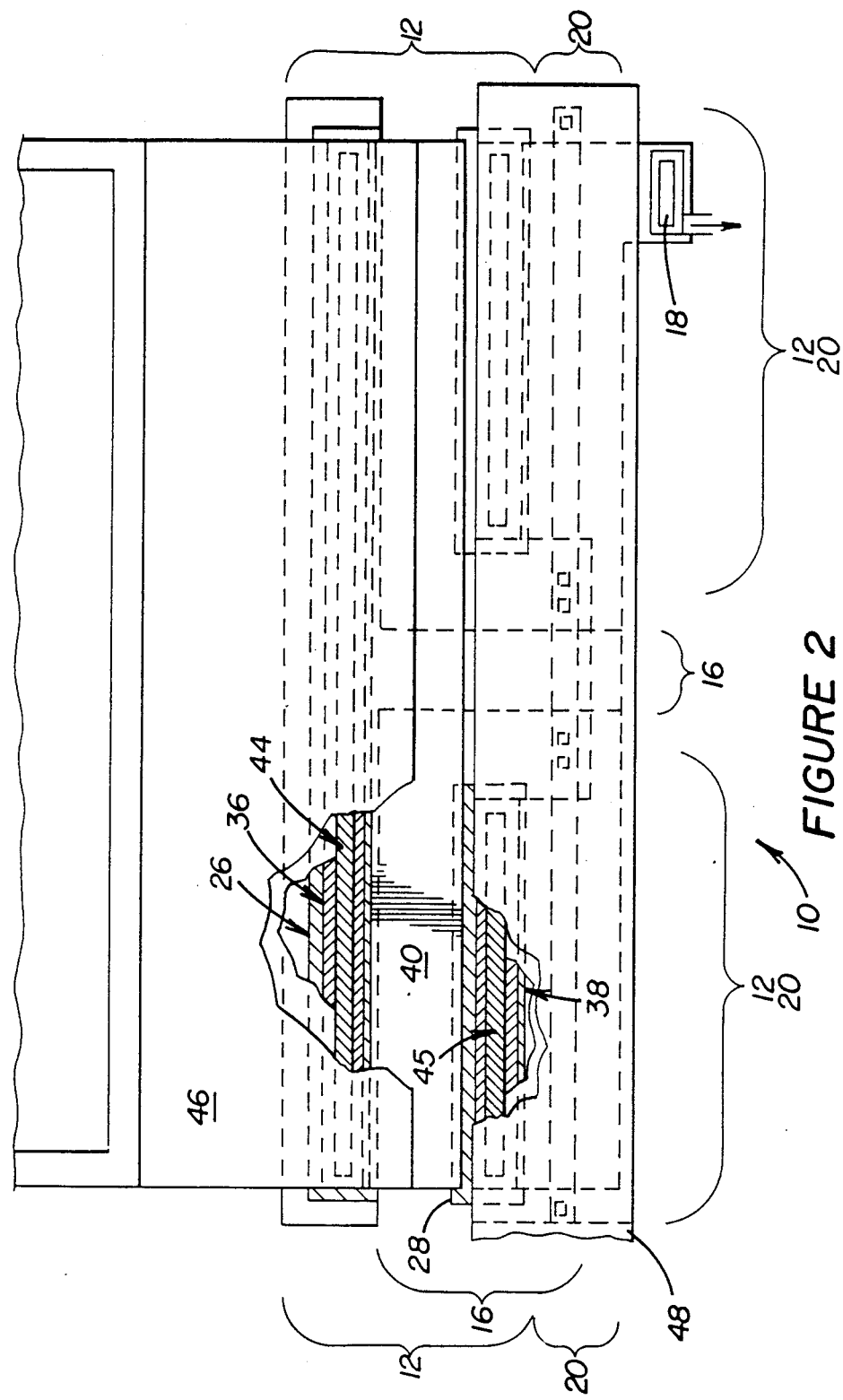
FIG. 2 is a plan view (top) layout of the device in one embodiment according to the present invention as shown in FIG. 1.

The ESD device 10 is shown in a top layout view in FIG. 2. As can be clearly noted, resistor 16 in this embodiment is a patterned extension of n-well 26 of clamp component 12. FIG. 2 provides one example for a layout of the present invention. In practice, various configurations of the three components 12, 16 20 can be used in accordance with the best practical layout of the particular integrated circuit for which the device 10 is used.

Figure 3:
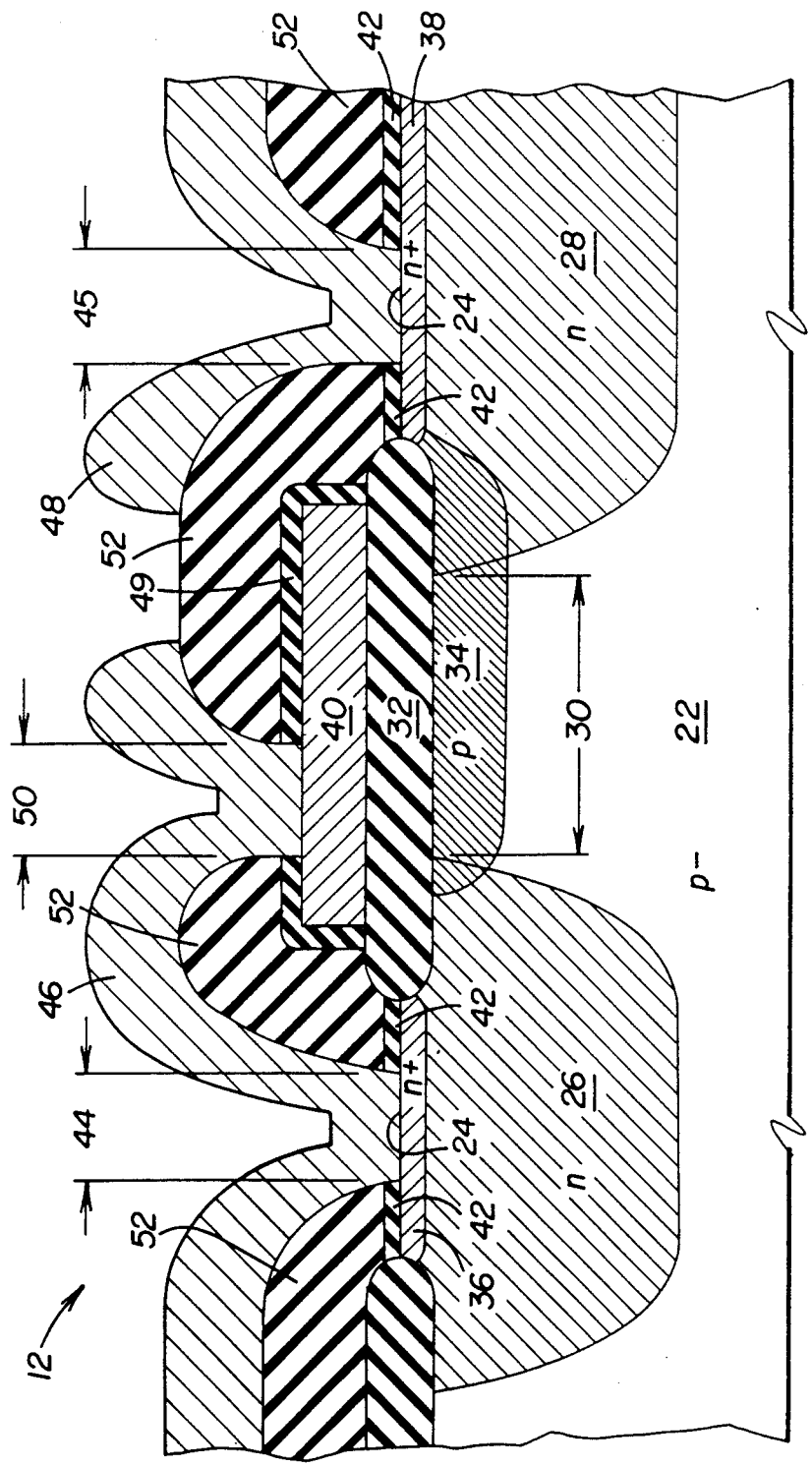
FIG. 3 is a schematic cross-sectional view of the first clamping component of the present invention as shown in FIG. 2.

Referring to FIG. 3, one embodiment of first clamp 12 is shown in schematic cross-section. This device is a deep well, thick field FET structure made, as shown, by a n-well or twin-well CMOS process. A substrate 22, such as a crystalline silicon substrate or an epitaxial silicon layer on a substrate, is lightly doped to provide a substrate 22 having a first conductivity type, in this embodiment p-, such as by incorporating boron ions to a concentration of approximately $10^{14}$ to $10^{15}$ per cm$^3$.

Into the surface 24 of the substrate 22, there is embedded a first well 26 and a second well 28 of a second conductivity type, n. The wells can be regions formed by masking and diffusing or implanting the substrate 22 with phosphorous ions to form a junction having a depth of approximately 2 to 4 microns and doping to a concentration of approximately $10^{16}$ per cm$^3$. The region 30 of the substrate 22 between the wells 26, 28 defines the FET channel which is approximately 8 to 14 microns in length. Superposing the channel 30 and overlapping the wells 26, 28 is a field oxide region 32, such as may be formed using conventional silicon dioxide thermal growth processes. Beneath the field oxide 32, the substrate 22 is doped with ions to create a region 34 of a first conductivity type, p, also known as the field implant region 34, having a concentration of approximately $10^{15}$ to $10^{16}$ per cm$^3$.

A first region 36 in the surface 24 within the first well 26 and a second region 38 in the surface 24 within the second well 28 are implanted with higher concentrations of dopant to create n+ region drain and source contacts, respectively. In the preferred embodiment, a typical concentration of arsenic ions would be approximately $10^{20}$ per cm$^3$.

Figure 5:
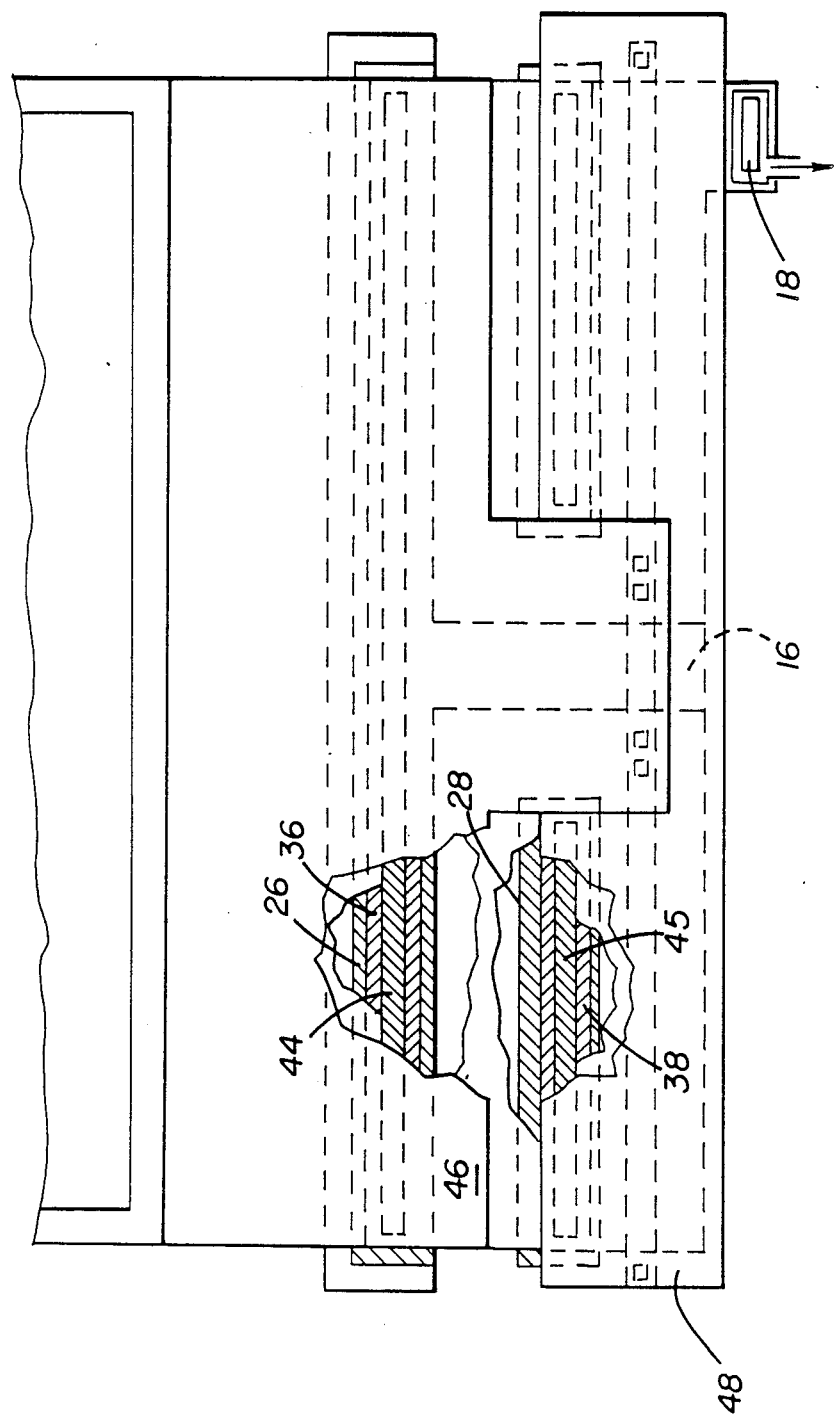
FIG. 5 is a plan view (top) layout drawing of the device according to the present invention as shown in FIG. 1 in a first embodiment.
Figure 7:
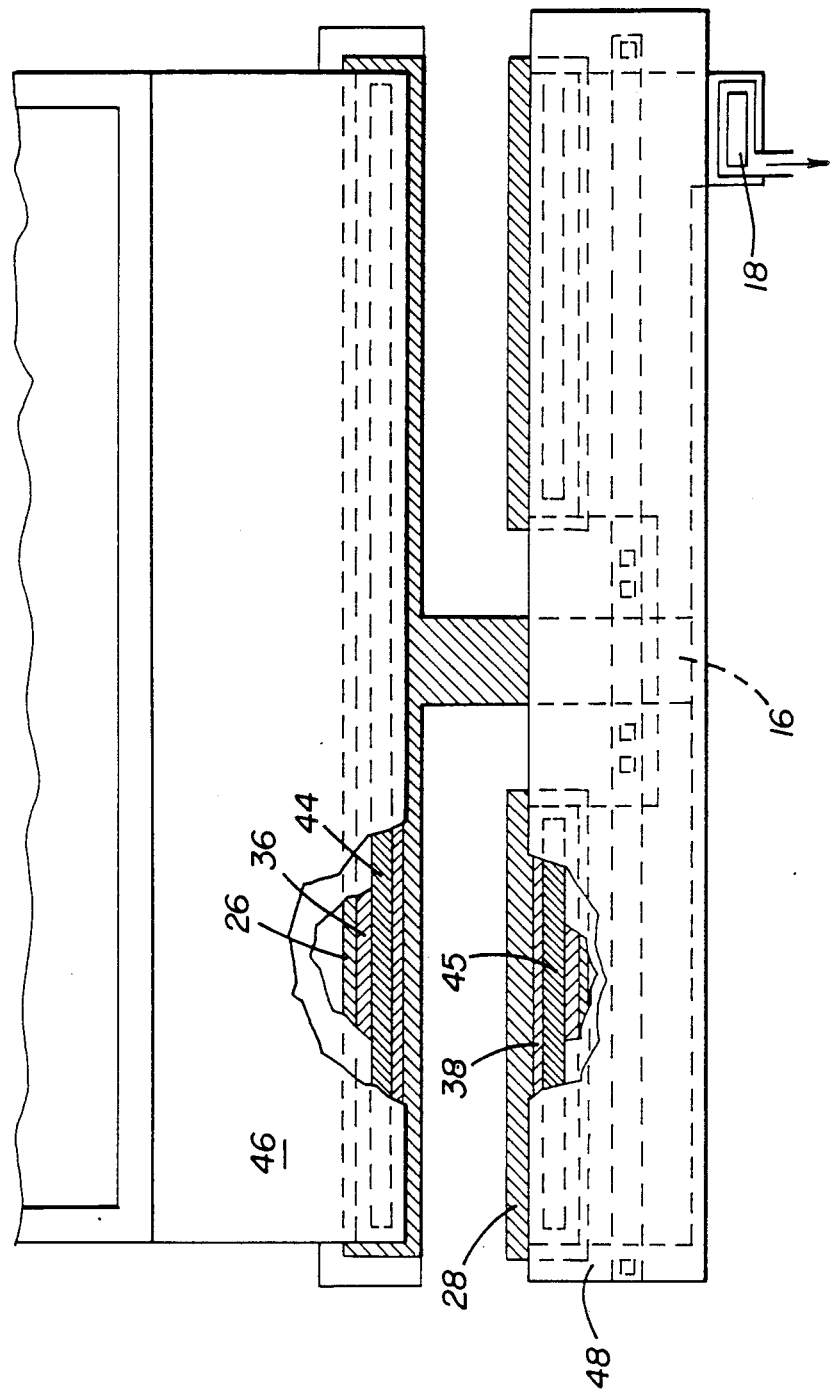
FIG. 7 is a plan view (top) layout drawing of the device according to the present invention as shown in FIG. 1 in a second embodiment.

The dimensions of the region 36 are approximately 7 microns × 150 microns. The junction depth is approximately 0.2 microns. The dimensions of the region 38 are proportioned accordingly as shown in FIGS. 2, 5 and 7.

A polysilicon gate 40 superposes the field oxide 32 and is dimensioned to overlap the n-well regions 26, 28. Drain and source oxides layers 42 have apertures 44, 45 wherein contact to the pad and circuit ground can be established via metal layers 46, 48 respectively. Polysilicon oxide layer 49 similarly is provided with an aperature 50 for coupling the gate 40 to the circuit pad, also via metal interconnect layer 46. Layers 52, such as CVD oxide, provide the necessary component insulator structures and are dimensioned accordingly.

So constructed, the first clamp component 12 of the preferred embodiment is a n-well to n-well, thick field FET which was found to turn-on at approximately 20 volts and, in a continuous duty test, was sinking approximately 9 milliamps at approximately 27 volts input to node 14. Tests show that with a drain and gate input of approximately 16 to 18 volts, a FET of this type will turn on if an n-well to n-well spacing of 10 microns is provided. Twelve microns was chosen to provide a safety margin.

Figure 4:
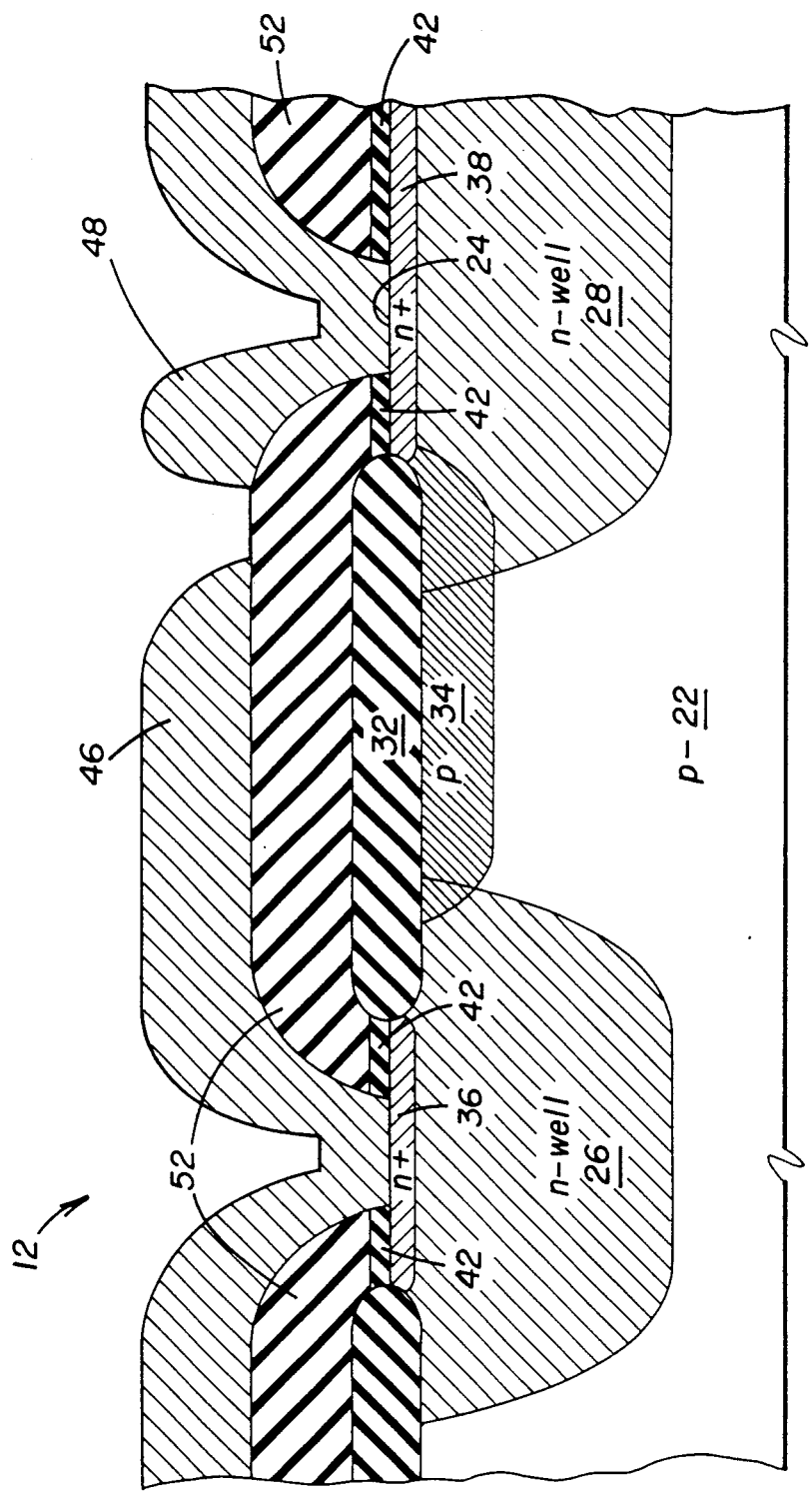
FIG. 4 is a schematic cross-sectional view of another embodiment of the first clamping component as shown in FIG. 3.

Another embodiment for the clamping component 12 is shown in FIG. 4 as might be desirable in a metal gate CMOS process. In this configuration, the poly-gate 40 is omitted and the space-charge layer conduction characteristic of the FET is controlled by a metal gate which is an extension of metal layer 46 over the field oxide 32 and insulator 52 which superposes the FET channel region 30. Although this has an advantage of being a simpler structure, test data indicates that this embodiment of clamping structure 12 requires a higher turn-on voltage, Vt. However, Vt is in the range of approximately 30 to 50 volts, which is still less than the n-well to substrate breakdown voltage. FIG. 5 shows a corresponding top view layout for this metal gate FET 12.

Figure 6:
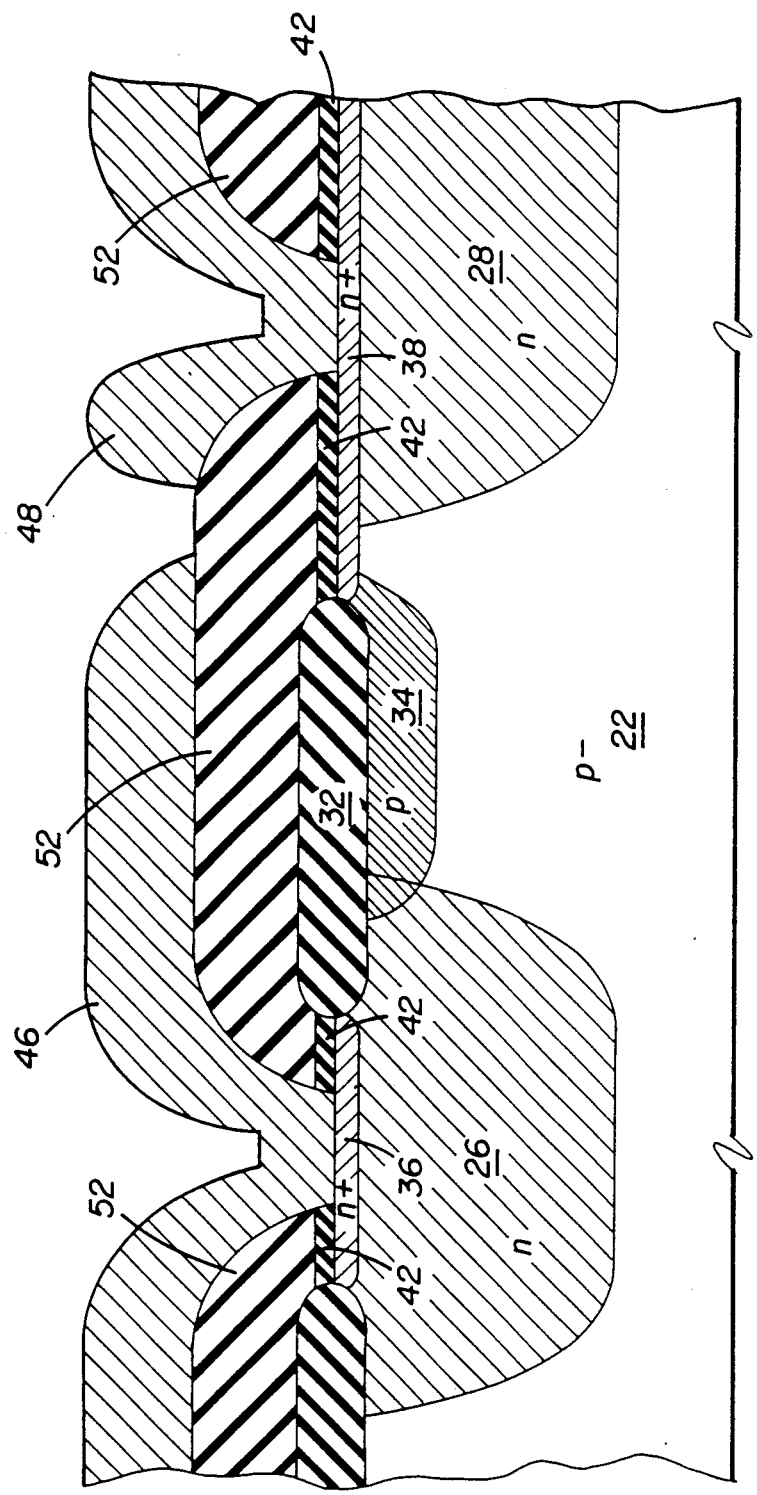
FIG. 6 is a schematic cross-sectional view of the first clamping component of the first embodiment of the present invention as shown in FIG. 5.

Another metal gate first clamp component 12 is shown in FIG. 6. A slight modification is made such that the channel region 30 extends from the n-well 26 to the source n+ contact 38, providing an n-well to n+ configuration of the first clamp component 12. The purpose of this configuration is to improve the clamping action by reducing the series resistance to ground.

In this embodiment wherein an n+ region serves as the source, the n-well on the source side of the device serves to prevent current crowding under the contact. The reduced series resistance to ground provided by the n-well to n+ device shown in FIG. 6 enhances the function of the ESD device 10 by sinking a larger voltage to ground.

Figure 8:
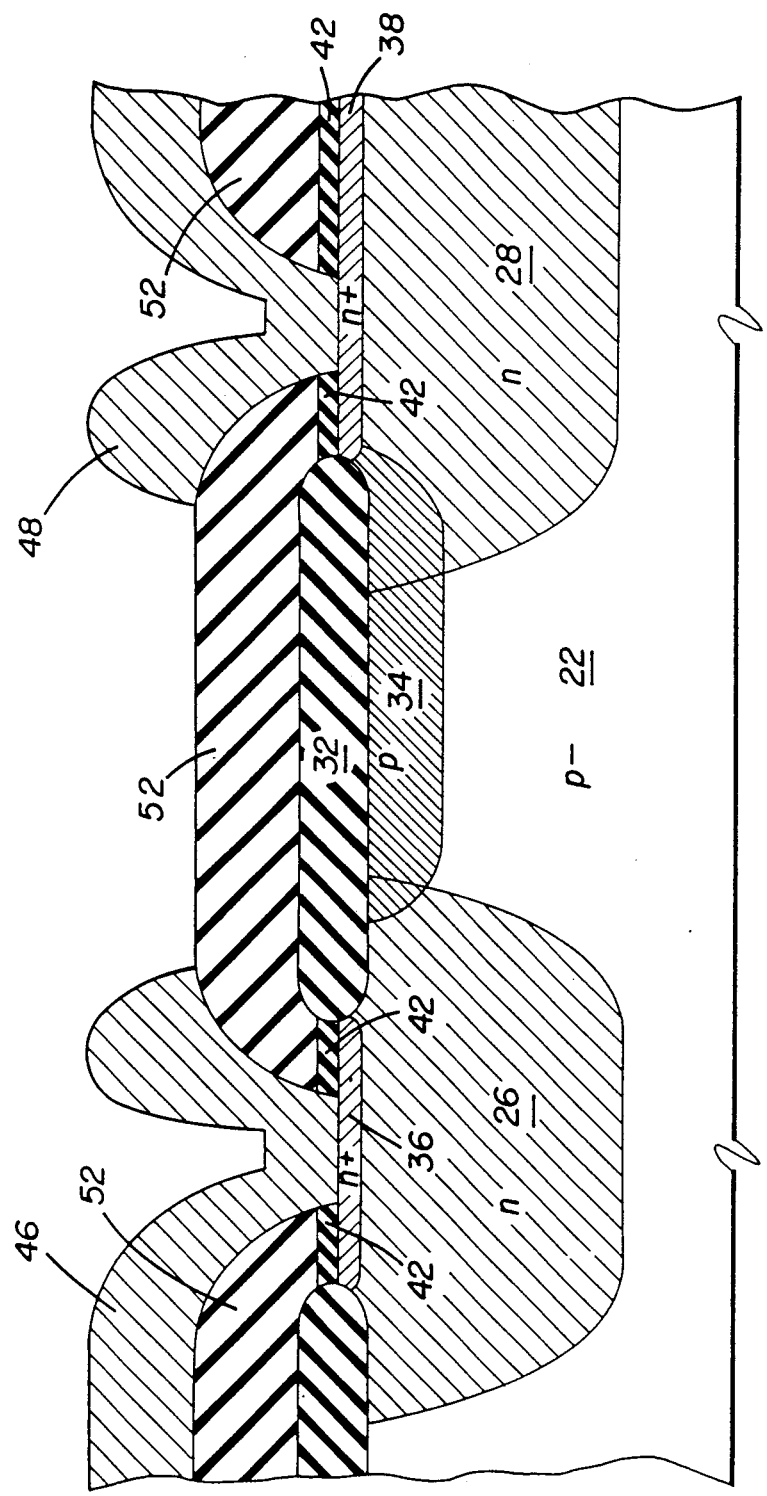
FIG. 8 is a schematic cross-sectional view of the first clamping component of the second embodiment of the present invention as shown in FIG. 7.
Figure 9:
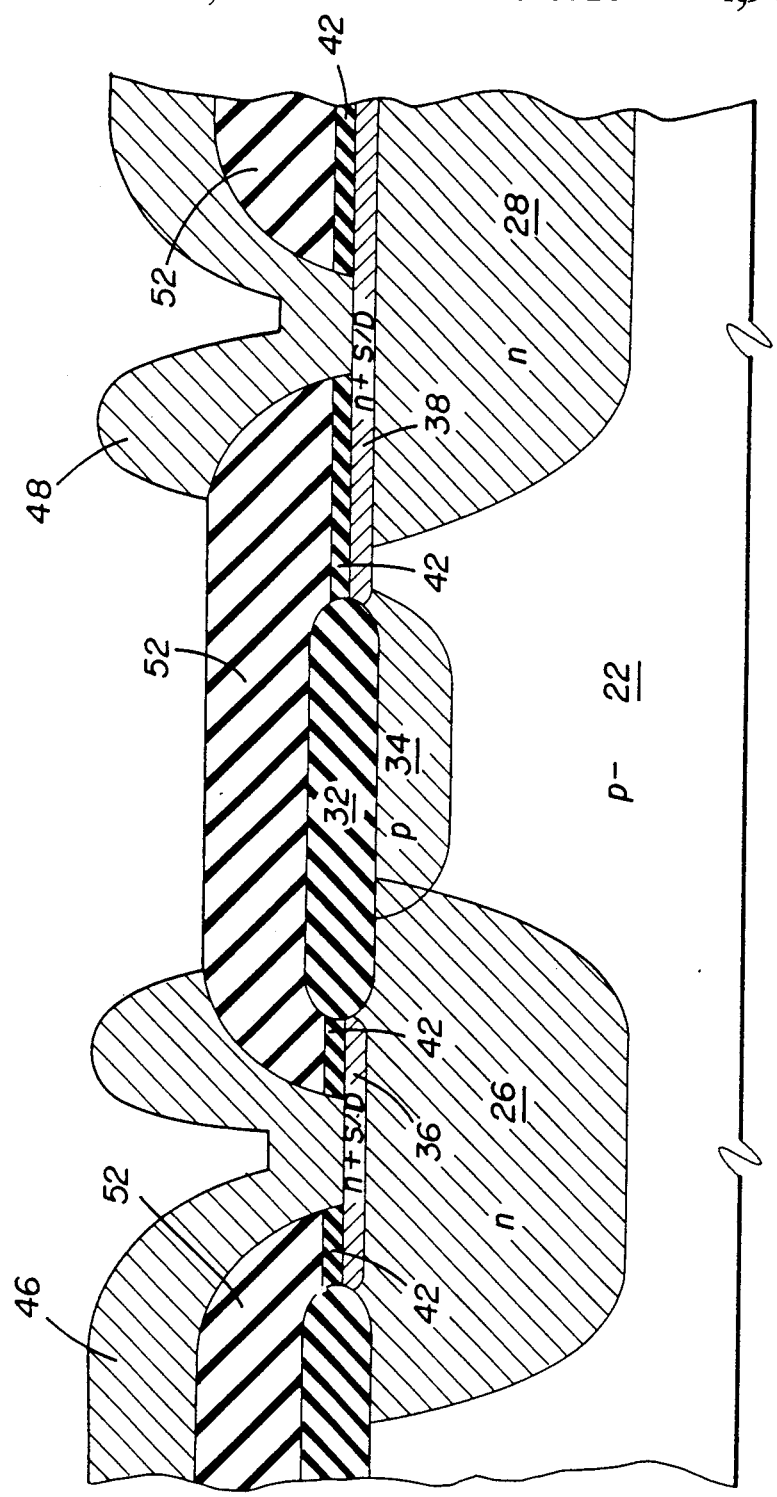
FIG. 9 is a schematic cross-sectional view of an embodiment of the first clamping component as shown in FIG. 8.

Yet another embodiment for the ESD device 10 is shown in the schematic layout of FIG. 7. The clamping component 12 in this embodiment is a non-gate device 12 as shown in FIGS. 8 and 9. The first clamp 12 in this arrangement is a punch-through device rather than a FET as in the first two embodiments of clamp 12. This is a much simpler construction than the poly-gate or metal-gate structures, but has a punch-through voltage which is approximately equal to the n-well to substrate breakdown voltage.

Figure 10:
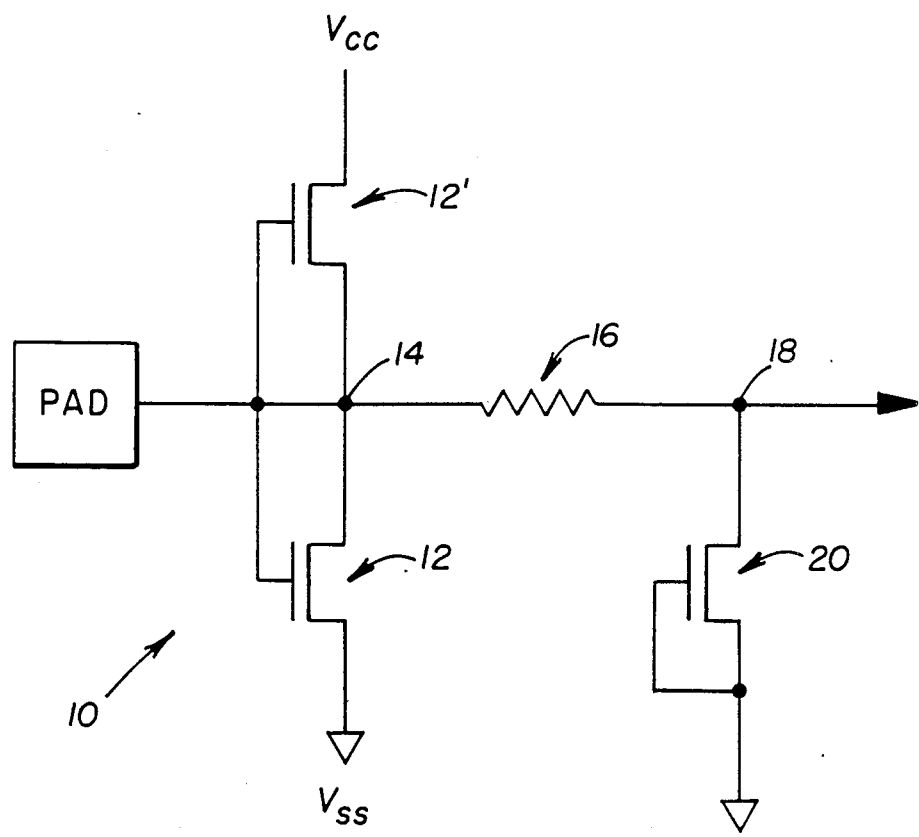
FIG. 10 is an electrical schematic diagram of a third embodiment of the present invention as shown in FIG. 1.

FIG. 10 illustrates an embodiment of the ESD device 10 in which an additional first clamping FET 12' has been added to the structure. The drain of the FET 12' is coupled to the circuit biasing potential, Vcc. The source of the FET 12' is coupled to input node 14 (and hence to the drain of FET 12). The gate of each FET 12, 12' is coupled to the pad. The additional clamp 12' provides a discharge path and clamps node 14 to Vcc during an on mode. It will be recognized that under an ESD test condition, Vcc may be floating or grounded. Although increasing device size and complexity, FET 12' may be required for some circuit layouts in order to achieve ESD protection for any pin relative to any other pin (including Vss and Vcc).

Conservative layout considerations have been found to provide the best possible integrated circuit protection. The width of the first clamp is relatively large in order to have a low resistance. In the preferred embodiment the width of the first clamp component 12 is approximately 150 microns. A good interconnect to a poly-gate is also provided for the same purpose. The use of large n+ contacts, large n-well overlap of n+ regions, and specific n-well spacing can be chosen to prevent process sensitive fabrication problems from occurring. A relatively wide metal-to-metal spacing is used to prevent arcing during an ESD into the pad. Moreover, putting an n-well under the ground potential contact prevents current crowding.

It has been discovered that ESD protection devices 10 having first clamp components 12 formed with and without gates, e.g., polysilicon gate 40 or metal gate 46, provide substantially similar protection. This similarity in the protection provided by devices formed with and without gates suggests that the transistors forming the first clamp component 12 function as lateral NPN bipolar transistors or punch-through MOS devices rather than as gated MOS devices. In a punch-through device, the large potential of the drain region creates a depletion region at the junction of the drain region and the channel region. The depletion region spreads across the channel or the substrate to the source region. A further increase in the drain to source voltage causes the device to conduct current.

On the other hand, in a more likely situation, the first clamp component 12 functions as a NPN bipolar transistor. The n-well MOS devices utilized in the present invention inherently form an NPN bipolar device. In the case of n-channel MOS devices a lateral bipolar device is formed by the n-p junction between the drain and the channel and the p-n junction between the channel and the source. Because of the large voltages created by an electrostatic discharge, the drain (collector) to substrate junction breaks down. The resistance of the p⁻-type substrate, which is grounded allows the potential of the base region to rise enough for the bipolar device to turn on. The breakdown of the drain-substrate junction and the rise in the potential of the base occur more quickly than the creation of the inversion region necessary to turn on an FET device in the case of a gated or a punch-through first clamp component 12. Thus, it is believed more likely that the first clamp component 12 functions as an NPN bipolar transistor rather than an FET device.

Figure 11:
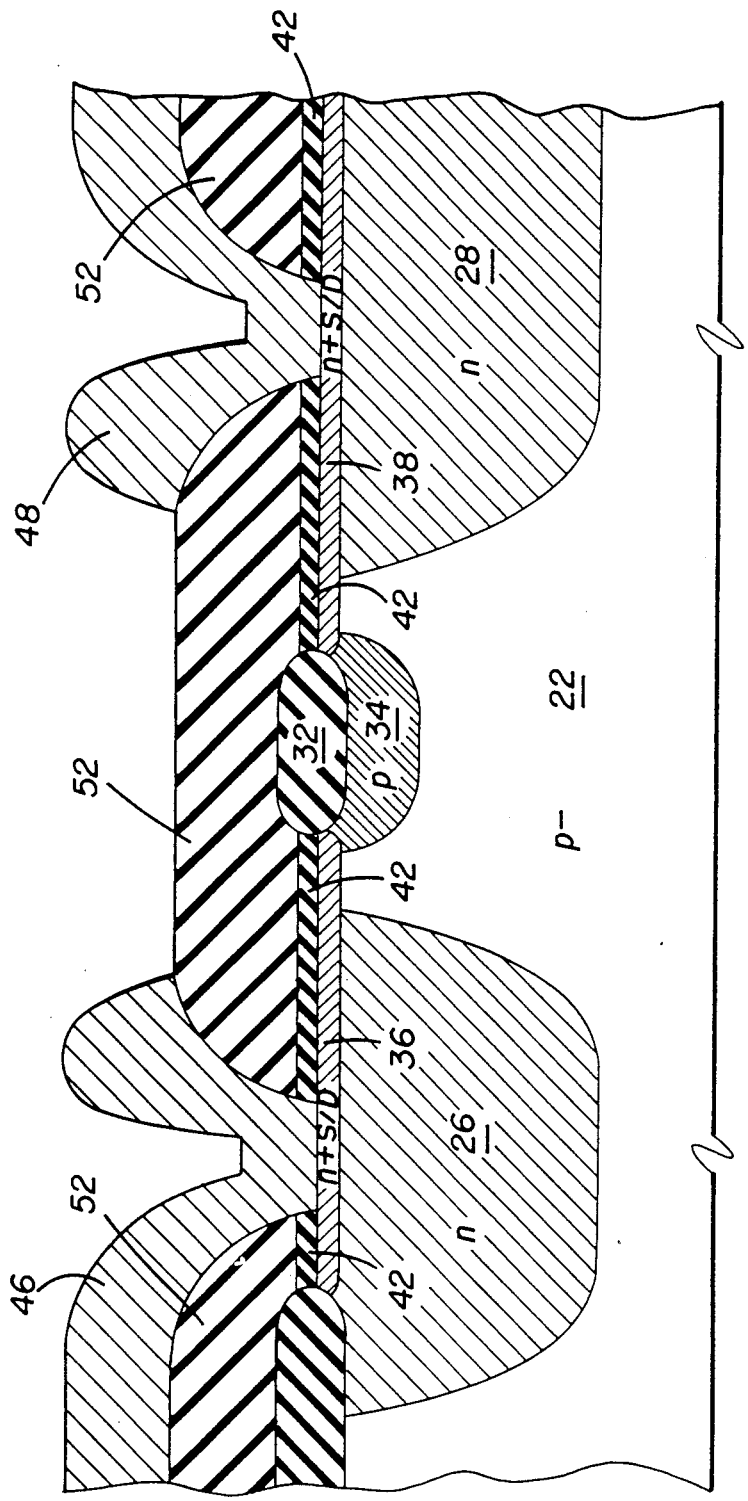
FIG. 11 is a schematic cross-sectional view of the first clamping component of a fourth embodiment of the present invention.

FIG. 11 illustrates an embodiment of the first clamp component 12 which is an n+ to n+ device without a gate, corresponding to a fourth embodiment of the present invention.

Specifically, n+ source and drain regions 36, 38 extend beyond the n-wells associated with the source and drain 26, 28 to contact the field implant region, or channel, 34. This n+ to n+ type device improves upon the performance achieved with n-well to n+ type devices. For example, n-well to n-well type devices without gates, as shown in FIG. 8, reliably sink approximately 2.5 kV to ground, and n-well to n+ devices without gates, as shown in FIG. 9, effectively sink approximately 4 kV to ground. However, n+ to n+ type devices without gates, as shown in FIG. 11, effectively sink approximately 5-6 kV to ground. It is noted that n-wells 26, 28 are still used in $n^{30}$ to n+ type devices. On the drain side of the device n-well 26 prevents spiking which can short the pad metal 46 to the substrate 22. The phenomenon of spiking is discussed in "A CMOS VLSI ESD Input Protection Device, DIFIDW," by C. M. Lynn, et al, Electrical Overstress/Electrostatic Discharge Symposium Proceedings 1984, p.202. The n-well 28 on the source side of the device prevents current crowding under the contact to the n+ source region 38.

Figure 12:
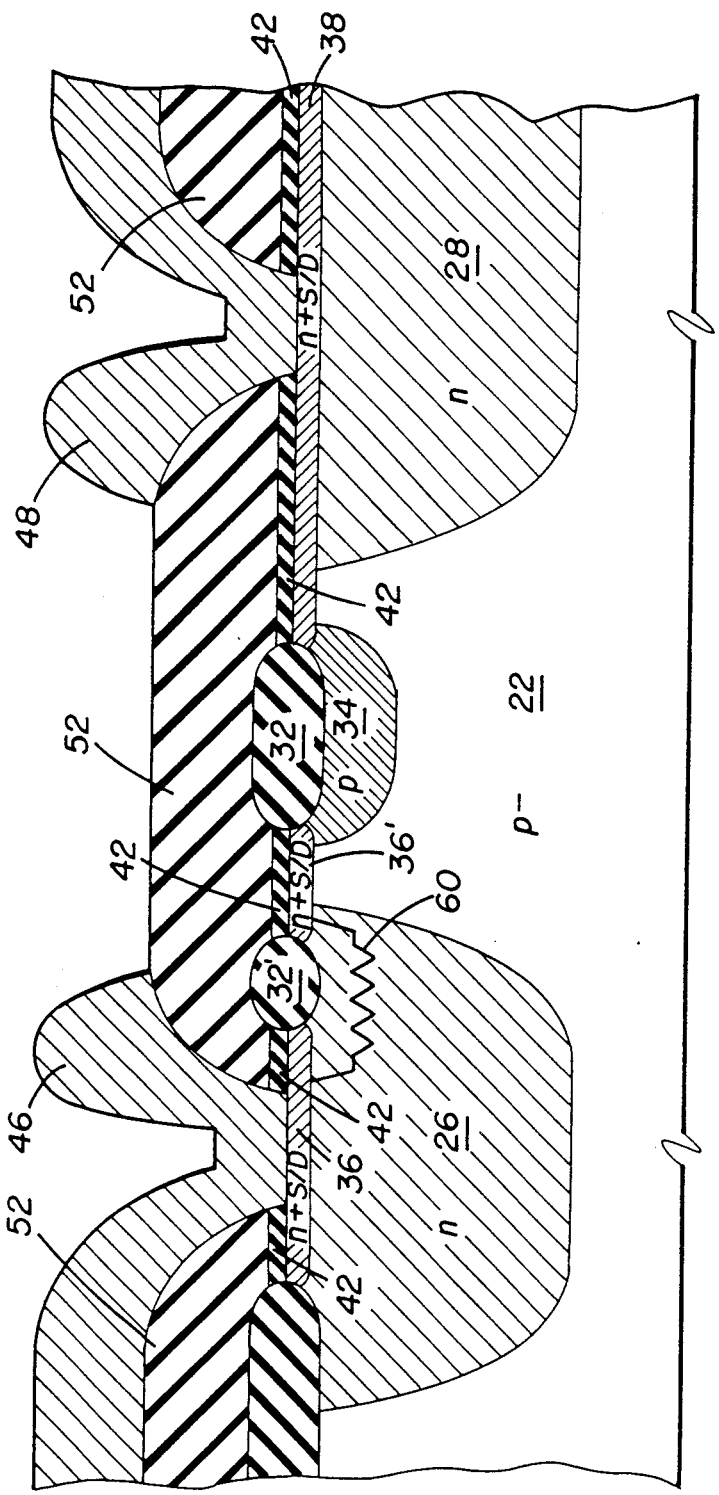
FIG. 12 is a schematic cross-sectional view of the first clamping component of a fifth embodiment of the present invention.

FIG. 12 illustrates a first clamp component which is an n+ to n+ type device without a gate having a ballast resistor, or limiting means, 60 coupled between the input and the drain region 36'. This first clamp component corresponds to a fifth embodiment of the present invention. The ballast resistor 60 is fabricated by providing a field oxide region 32' which divides the drain side n+ region into a drain contact region 36 and a drain region 36', thereby forcing current passing from the contact region 36 to the drain region 36' to flow through the n-well 26. The ballast resistor 60 limits the current which flows during the breakdown of the n+-p junction between the drain 36' and the field implant region 34 before the NPN bipolar or punch-through type device turns on. If the current which flows during the breakdown is too large, the breakdown can be a destructive event; thus, the ballast resistor is provided to prevent any destructive action during the breakdown. N+ to n+ type devices without gates and having a ballast resistor 60 have been shown to effectively sink approximately 7 kV to ground.

Figure 13:
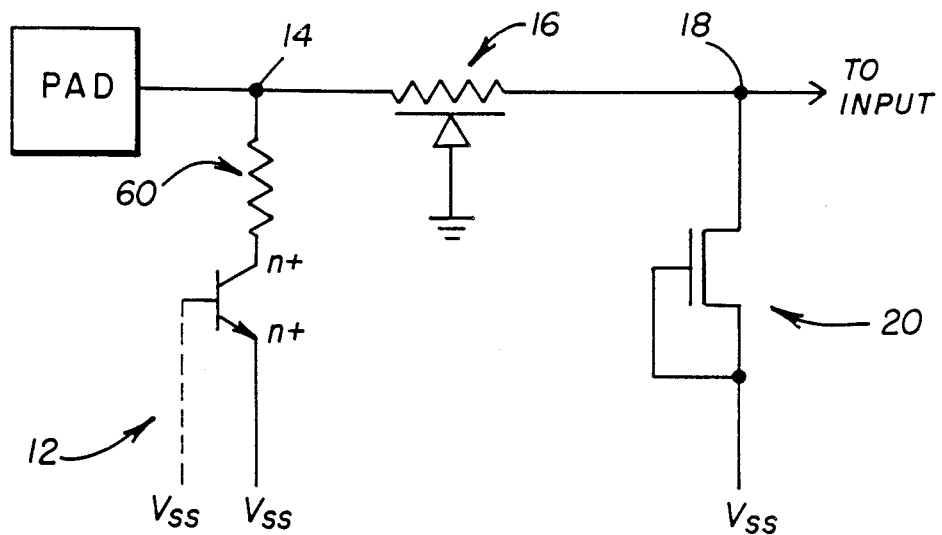
FIG. 13 is an electrical schematic diagram of the fifth embodiment of the present invention as shown in FIG. 12.

FIG. 13 is a schematic diagram of the first clamping component 12 of the fifth embodiment of ESD 10. Particularly, FIG. 13 illustrates the ballast resistor 60 coupled between the first input node 14 and the input of the NPN bipolar or punch-through device.

Figure 14:
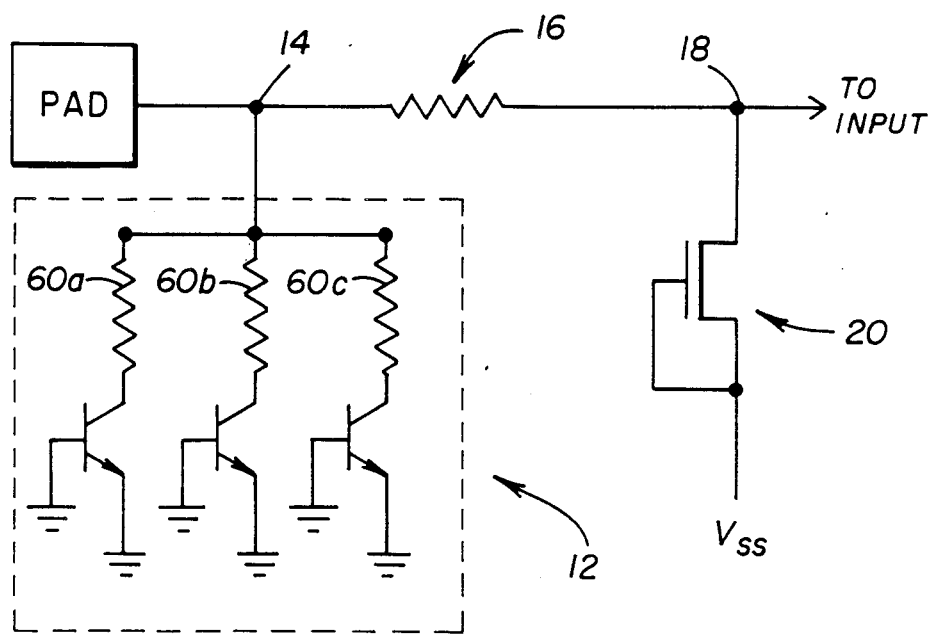
FIG. 14 is an electrical schematic diagram of the sixth embodiment of the present invention.

FIG. 14 is a schematic diagram illustrating a first clamp component 12 in which plural, e.g., three (3), NPN bipolar or punch-through devices are connected in parallel through ballast resistors 60a-c to first node 14; a sixth embodiment of the ESD 10 of the present invention. The advantage of using plural transistor devices is that the benefits achieved by ballast resistors 60a-c are enhanced. In FIG. 12, the breakdown of the junction between the n+ drain region 36' and the p-type channel 34 is a localized phenomenon. Thus, the current flows to the junction only at the point of the breakdown. If the junction is wide, i.e., if the dimension of the device in the direction perpendicular to the length of the gate is large, many parallel current paths will be established between the n+ drain contact 36 and the point at which the junction of the n+ drain 36' to channel 34 breaks down. Each current path will have a resistance which depends on the length and route of the current path. The overall resistance for all of the current paths will be the combination of the parallel resistances of the individual paths.

Since the combination of parallel resistances is less than the value of the largest resistance, the overall resistance decreases. This decrease in resistance reduces the effectiveness of the single ballast resistor 60. Different breakdown points will also result in different sets of current paths with different effective ballast resistances. However, by breaking the device into several smaller devices each having a small gate width, each device is limited to fewer current paths, and ideally only one current path. This increases and makes more uniform the ballast resistance for any breakdown point in the clamping means 12, and thus limits the current flowing during breakdown.

Figure 15:
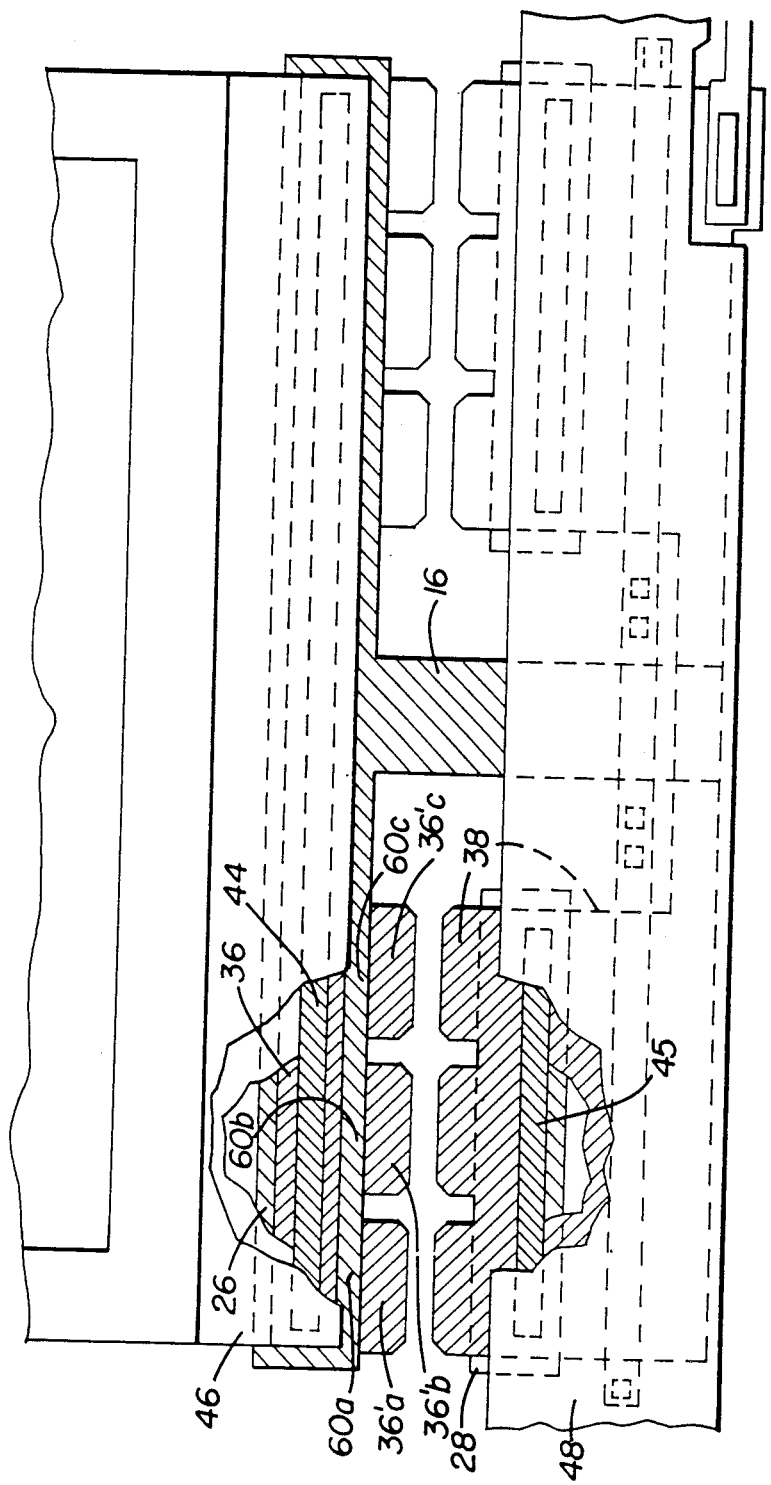
FIG. 15 is a plan view (top) layout of the sixth embodiment of the present invention as shown in FIG. 14.

FIG. 15 is a plan view which illustrates the layout of the device shown schematically in FIG. 14. Particularly, the ballast resistors 60a-c and the sawtooth like plural transistor devices comprise the first clamp component.

In addition to the layouts as shown, conventional guard rings can be added round the ESD device 10 to prevent latch-up by collecting substrate current produced when an input pad undershoot condition forward biases the input junction.

The foregoing description of the present invention has been presented for purposes of illustration and description. It is not intended to be exhaustive or to limit the invention to the precise form disclosed. Obviously, many modifications and variations will be apparent to practitioners skilled in the art. The embodiments were chosen and described in order to best explain the principles of the invention and its practical application, to thereby enable others skilled in the art to best understand the invention for various embodiments and with various modifications as are suited to the particular use contemplated. It is intended that the scope of the invention be defined by the claims appended hereto and their equivalents.

We claim:

1. An ESD protection device for an integrated circuit provided in a substrate having an input pad, comprising:
    n-well to n+ clamping means, including a first input node coupled to the input pad and a first output node coupled to ground potential of the integrated circuit, for sinking to ground at least a first portion of an input current associated with an electro-static voltage discharge to the input pad and for clamping said first input node at a first clamp voltage which is less than the electro-static discharge voltage, comprising:
        an first n-well, having a depth and a doping concentration, provided in the substrate,
        an n+ region, having a larger doping concentration and a shallower depth than said first n-well, said n+ region being provided in the substrate and spaced apart from said first n-well to define a channel therebetween and contacting said channel, and
        a second n-well having a smaller doping concentration than said n+ region said second n-well being provided in said substrate under said n+ region;
    second clamping means, having a second input node, for sinking to ground a second portion of the input current and for clamping said second input node at a voltage which is less than the first clamp voltage; and
    limiting means for coupling said first input node to said second input node and for limiting the flow of current from said first input node to said second input node.

2. An electro-static discharge ESD protection device for an integrated circuit provided in a p-type substrate and having an input pad, comprising:
    n+ to n+ clamping means, comprising:
        first and second n-well regions formed in said substrate and having a depth and a doping concentration, and
        a first n+ region formed in said first n-well, said first n+ region having a larger doping concentration and a shallower depth than said first n-well region and being electrically interconnected with said input pad.

a second n+ region partially formed in said first n-well region, said second n+ region having a larger doping concentration and a shallower depth than said first n-well region, said second n+ region being spaced apart from said first n+ region so that a portion of said first n-well forms a ballast resistor which electrically interconnects said first and second n+ regions, a third n+ region partially formed in said second n-well region, said third n+ region having a larger doping concentration and a shallower depth than said second n-well region, said third n+ region being electrically interconnected with ground potential, said second and third n+ regions being spaced apart to define a channel therebetween, each of said second and third n+ regions contacting said channel, for sinking to ground at least a first portion of an input current associated with an electro-static voltage discharge to the input pad and for clamping said input pad at a first clamp voltage which is less than the electro-static discharge voltage;

second clamping means, having an input node, for sinking to ground a second portion of the input current and for clamping said input node at a voltage which is less than the first clamp voltage; and first limiting means for electrically interconnecting said input pad and said input node and for limiting the flow of current from said input pad to said input node.

3. An ESD protection device according to claim 2, wherein said second clamping means comprises a thin gate-oxide, long channel, enhancement mode FET having a gate coupled to ground potential.

4. An ESD protection device according to claim 2, wherein said ESD protection device comprises a plurality of n+ to N+ clamping means, said first n+ region of each of said plural n+ to n+ clamping means being electrically coupled in parallel to said input pad.

5. An electro-static discharge (ESD) protection device for an integrated circuit formed in a substrate and having an input pad, comprising:

first clamping means, having a first input node coupled to the input pad, for sinking to ground at least a first portion of an input current associated with a electro-static voltage discharge to the pad and for clamping said first input node at a first clamp voltage which is less than the electro-static discharge voltage, said first clamping means comprising:

a plurality of n+ to n+ transistor means each having first and second n-wells formed in the substrate each having a depth and a doping concentration, first and second n+ regions partially formed in respective ones of said n-wells and having a larger doping concentration and a shallower depth than the corresponding n-well, said n+ regions being spaced apart to define a channel region therebetween, each said second n+ region being electrically connected to ground potential, and a plurality of first limiting means, each having an input coupled in parallel with the inputs of each of the other limiting means to said first input node and an output coupled to said first n+ region of a respective one of said n+ to n+ transistor means;

second clamping means, having a second input node, for sinking to ground a second portion of the input current and for clamping said second input node at a voltage which is less than the first clamp voltage; and second limiting means for coupling said first input node to said second input node and for limiting the flow of current from said first input node to said second input node.

6. An ESD protection device according to claim 5, wherein:

said plural n+ to N+ transistor means each comprise a punch-through FET;

said first n+ region forms an n+ drain region;

said second n+ region forms an n+ source region; and said plural first limiting means each comprise a ballast resistor formed by a portion of said first n-well in corresponding, respective ones of said punch-through FETs.

7. An ESD protection device according to claim 5, wherein:

said plural n+ to n+ transistor means each comprise a lateral NPN bipolar transistor;

said first n+ region forms an N+ collector region;

said second n+ region forms an n+ emitter region; and said plural first limiting means each comprise a ballast resistor formed by a portion of said first n-well in corresponding, respective ones of said lateral NPN bipolar transistors.

8. An electro-static discharge (ESD) protection device for an integrated circuit provided on a substrate and having an input pad, comprising:

n-well to n+ clamping means, comprising:

a first input node electrically interconnected to the input pad, a first n-well region having a first doping concentration provided in the substrate, an n+ source contact region, having a second doping concentration greater than the first doping concentration, said n+ source contact region having a first portion provided in the substrate and a second portion provided in said first n-well and being electrically interconnected to ground potential, an second n-well region, having a third doping concentration which is less than said second doping concentration, provided in the substrate, said first portion of said n+ source contact region and said second n-well region being spaced apart to define a channel therebetween, said channel directly contacting said first portion of said n+ source contact region, and an n+ drain contact region, having a fourth doping concentration greater than the third doping concentration, provided in the substrate in said second n-well contact region and electrically interconnected to said first input node, for sinking to ground at least a first portion of an input current associated with an electro-static voltage discharge to the input pad and for clamping said first input node to a first clamp voltage which is less than the electro-static discharge voltage;

second clamping means, having a second input node, for sinking to ground a second portion of the input current and for clamping said second input node at a voltage which is less than the first clamp voltage; and limiting means for electrically interconnecting said first and second input nodes and for limiting the flow of current from said first input node to said second input node.

9. An ESD protection device according to claim 8, comprising plural n-well to n+ clamping means, said input node of each of said plural n-well to n+ clamping means being connected to the input node of each of the other plural n-well to n+ clamping means in parallel.

10. An electro-static discharge (ESD) protection device for an integrated circuit provided on in a substrate and having an input pad, comprising:

n+ to n+ clamping means, comprising:
- a first input node electrically interconnected to the input pad,
- first and second n-wells provided in the substrate, each n-well having a doping concentration,
- an n+ source contact region, having a doping concentration greater than the doping concentration of said first n-well, said n+ source contact region having a first portion provided in the substrate and a second portion provided in said first n-well and electrically interconnected to ground potential, and
- an n+ drain contact region, having a doping concentration greater than the doping concentration of said second n-well, said n+ drain contact region having a first portion provided in the substrate and a second portion provided in said second n-well and electrically interconnected with said first input node, said n+ source contact region and said n+ drain contact region being spaced apart to define a channel therebetween, said channel directly contacting said first portion of said n+ source contact region and said first portion of said n+ drain contact region, for sinking to ground at least a first portion of an input current associated with an electro-static voltage discharge to the input pad and for clamping said first input node to a first clamp voltage which is less than the electro-static discharge voltage;

second clamping means, having a second input node, for sinking to ground a second portion of the input current and for clamping said second input node at a voltage which is less than the first clamp voltage; and limiting means for electrically interconnecting said first and second input nodes and for limiting the flow of current from said first input node to said second input node.

11. An ESD protection device according to claim 10, comprising plural n+ to n+ clamping means, said input node of each of said plural n+ to n+ clamping means being connected to said input node of each of said other n+ to n+ clamping means in parallel.

* * * * *